United States Patent
Bae et al.

(10) Patent No.: US 7,802,210 B2
(45) Date of Patent: Sep. 21, 2010

(54) METHODS AND SYSTEMS FOR ANALYZING LAYOUTS OF SEMICONDUCTOR INTEGRATED CIRCUIT DEVICES

(75) Inventors: Choel-Hwyi Bae, Gyeonggi-do (KR); Gwang-Hyeon Baek, Seoul (KR); Min-Geon Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 693 days.

(21) Appl. No.: 11/654,340

(22) Filed: Jan. 17, 2007

(65) Prior Publication Data
US 2007/0174800 A1 Jul. 26, 2007

(30) Foreign Application Priority Data
Jan. 23, 2006 (KR) .................. 10-2006-0006959

(51) Int. Cl.
*G06F 17/50* (2006.01)
(52) U.S. Cl. .............................................. 716/4; 716/5
(58) Field of Classification Search .................. 716/4–5, 716/11
See application file for complete search history.

(56) References Cited

U.S. PATENT DOCUMENTS

| 6,449,749 | B1 | 9/2002 | Stine | |
|---|---|---|---|---|
| 2007/0156379 | A1* | 7/2007 | Kulkarni et al. | ............... 703/14 |

FOREIGN PATENT DOCUMENTS

| JP | 2003-242189 | 8/2003 |
|---|---|---|
| JP | 2004-031891 | 1/2004 |

\* cited by examiner

*Primary Examiner*—Paul Dinh
(74) *Attorney, Agent, or Firm*—Myers Bigel Sibley & Sajovec, P.A.

(57) ABSTRACT

Disclosed is a method of analyzing layouts of semiconductor integrated circuit devices. The method includes calculating random fault rates, systematic fault rates, parametric fault rates, and areas of a plurality of layouts of interest; calculating area-based fault rates of the plurality of layouts of interest using the random fault rate, systematic fault rate, parametric fault rate, and area; and selecting layouts of interest to be corrected from among the plurality of layouts of interest using the area-based fault rates of the plurality of layouts of interest.

7 Claims, 13 Drawing Sheets

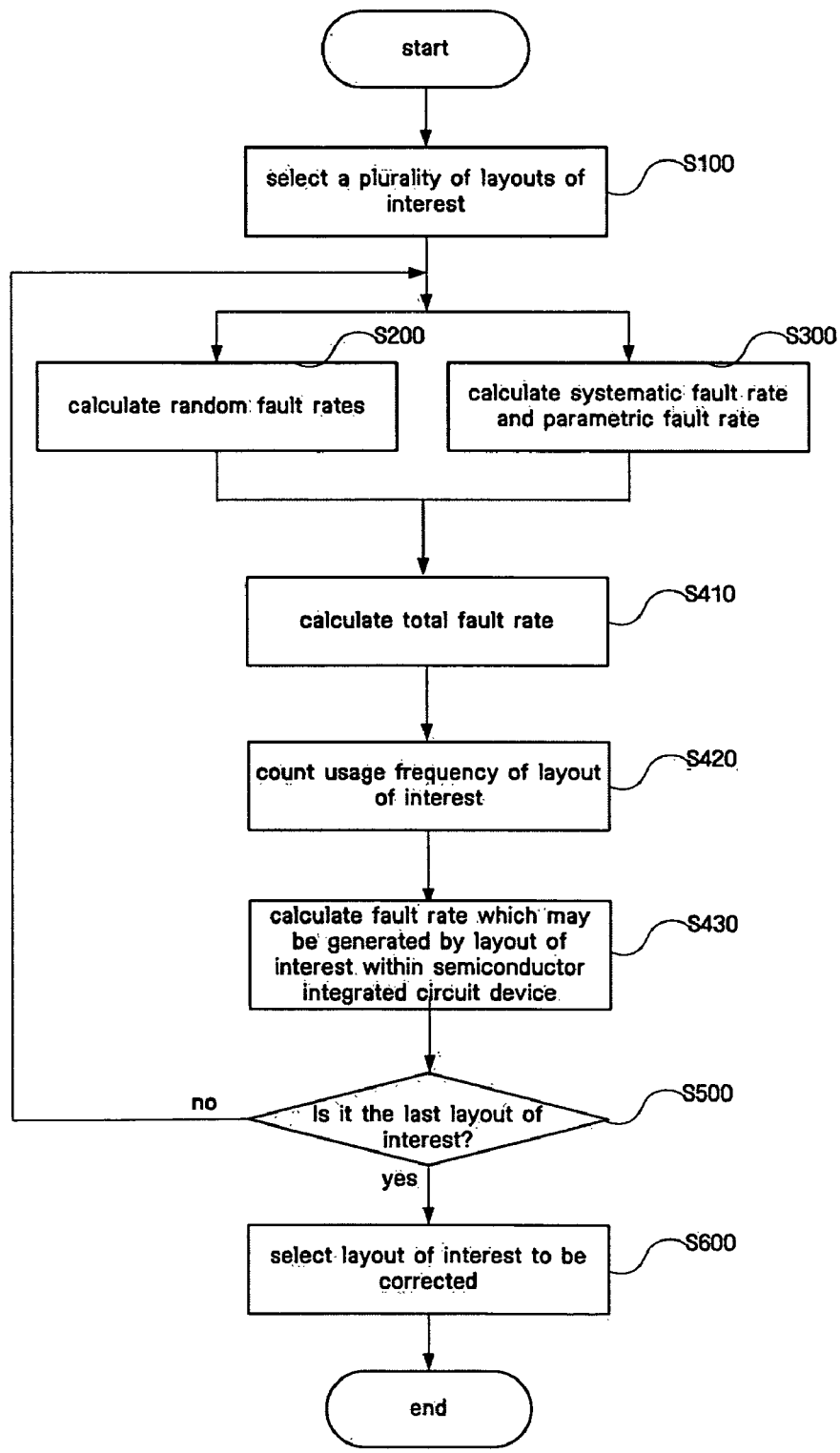

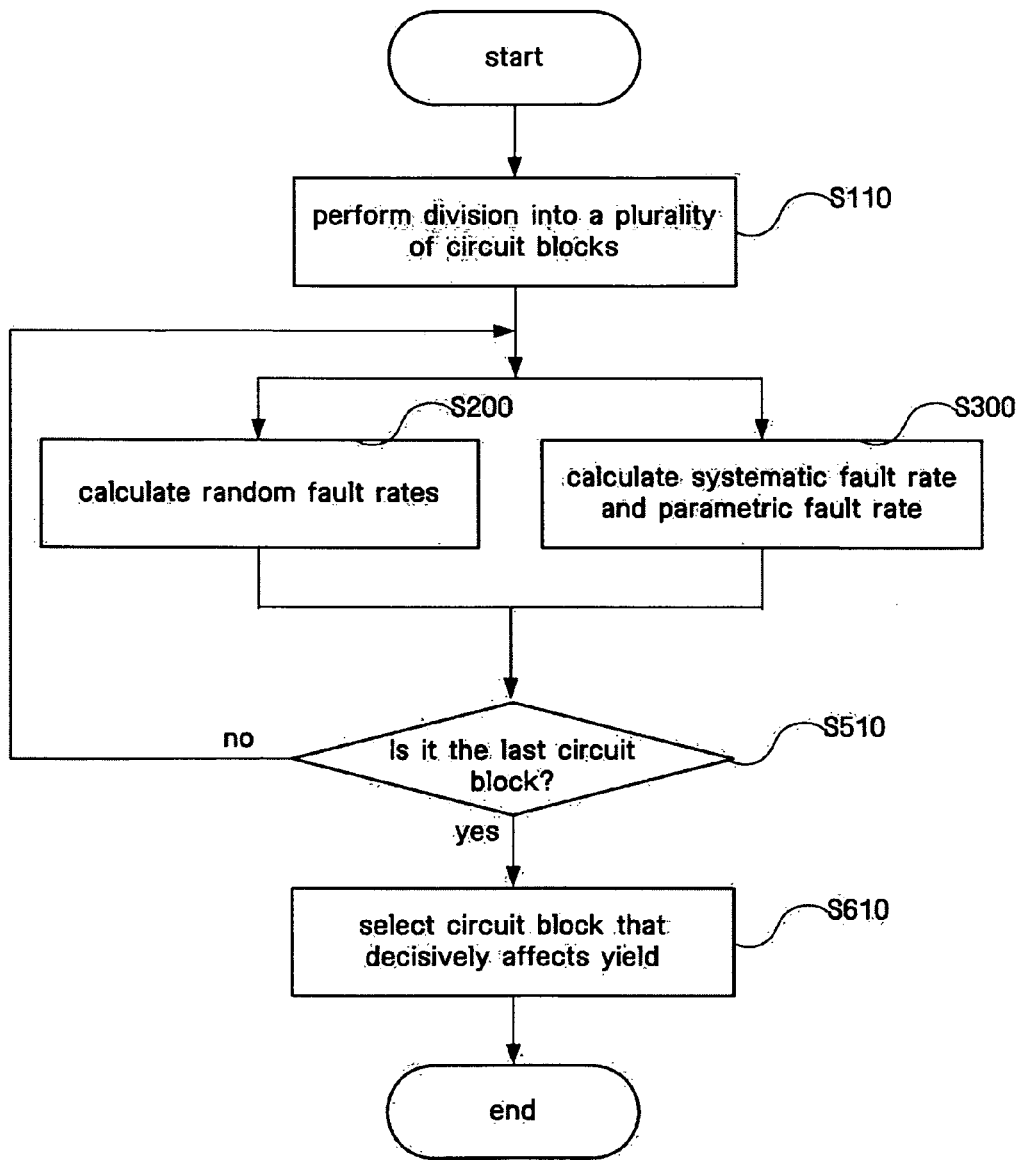

METHODS AND SYSTEMS FOR ANALYZING LAYOUTS OF SEMICONDUCTOR INTEGRATED CIRCUIT DEVICES

CROSS-REFERENCE TO RELATED APPLICATION

This application claims from the benefit under 35 U.S.C. §119 of Korean Patent Application No. 10-2006-0006959 filed on Jan. 23, 2006, the disclosure of which is incorporated herein by reference in its entirety.

FIELD OF THE INVENTION

The present invention relates generally to semiconductor devices and, more particularly, to methods and systems for analyzing the layouts of semiconductor integrated circuit devices.

BACKGROUND OF THE INVENTION

With the rapid increase in the technological level and the complexity of semiconductor design, interest in Design For Manufacturability (DFM) is increasing. In particular, in order to realize yield enhancement, the development of a recommended rule for DFM methods is underway. The recommended rule has a value which is backed off a minimum design rule by a predetermined amount.

In detail, the design of the layout of a semiconductor integrated circuit device is dependent on a minimum design rule value (or ground rule value). The minimum design rule value represents the limitation of resolution in current photo-processing, and, in particular, refers to a minimum space interval, a minimum overlap area or the like between various masks or within a mask used in the semiconductor integrated circuit device. However, when current processing technology does not satisfy the minimum design rule value, the yield can be rapidly enhanced using a recommended rule value which is slightly higher than the minimum design rule value in the layout design of a semiconductor integrated circuit device.

SUMMARY OF THE INVENTION

In accordance with an embodiment of the present invention, a method of analyzing layouts of semiconductor integrated circuit devices includes calculating random fault rates, systematic fault rates, parametric fault rates, and areas of a plurality of layouts of interest; calculating area-based fault rates of the plurality of layouts of interest using the random fault rates, the systematic fault rates, the parametric fault rates, and the areas; and selecting layouts of interest to be corrected from among the plurality of layouts of interest using the area-based fault rates.

Additionally, in accordance with another embodiment of the present invention, a method of analyzing layouts of semiconductor integrated circuit devices includes calculating random fault rates, systematic fault rates, and parametric fault rates of a plurality of layouts of interest; calculating total fault rates of the plurality of layouts of interest using the random fault rates, the systematic fault rates and the parametric fault rates; counting usage frequencies of the plurality of layouts of interest within a semiconductor integrated circuit device; and calculating fault rates which may be generated by the plurality of layouts of interest within a semiconductor integrated circuit device using the total fault rates and the usage frequencies.

Additionally, in accordance with another embodiment of the present invention, a method of analyzing layouts of semiconductor integrated circuit devices includes dividing a semiconductor integrated circuit device into a plurality of circuit blocks; calculating at least one of a random fault rate, a systematic fault rate and a parametric fault rate for each of the circuit blocks; and selecting yield-critical circuit blocks using the calculated random fault rates, systematic fault rates and parametric fault rates of the circuit blocks.

Additionally, in accordance with an embodiment of the present invention, a system for analyzing layouts of semiconductor integrated circuit devices includes a random fault rate calculation unit for calculating random fault rates of a plurality of layouts of interest; a systematic fault rate calculation unit calculating systematic fault rates of the plurality of layouts of interest; a parametric fault rate calculation unit calculating parametric fault rates of the plurality of layouts of interest; an area-based fault rate calculation unit calculating area-based fault rates of the plurality of layouts of interest; and a control unit selecting layouts of interest to be corrected from among the plurality of layouts using the area-based fault rates of the plurality of layouts.

Additionally, in accordance with another embodiment of the present invention, a system for analyzing layouts of semiconductor integrated circuit devices includes a random fault rate calculation unit calculating random fault rates of a plurality of layouts of interest; a systematic fault rate calculation unit calculating systematic fault rates of the plurality of layouts of interest; a parametric fault rate calculation unit calculating parametric fault rates of the plurality of layouts of interest; a total fault rate calculation unit calculating total fault rates from the random fault rates, systematic fault rates, and parametric fault rates; a counter respectively counting usage frequencies of the layouts of interest within a semiconductor integrated circuit device; and a fault rate calculation unit calculating fault rates which may be generated by the layouts of interest within the semiconductor integrated circuit device using the total fault rates and the frequencies.

Additionally, in accordance with still another embodiment of the present invention, a system for analyzing layouts of semiconductor integrated circuit devices includes a random fault rate calculation unit calculating random fault rates for circuit blocks, wherein a semiconductor integrated circuit device which is divided into a plurality of circuit blocks; a systematic fault rate calculation unit calculating systematic fault rates for the circuit blocks; a parametric fault rate calculation unit calculating parametric fault rates for the circuit blocks; and a control unit selecting yield-critical circuit blocks using the calculated random fault rates, the systematic fault rates and the parametric fault rates for the circuit blocks.

BRIEF DESCRIPTION OF THE DRAWINGS

The above and other features and advantages of the present invention will be more clearly understood from the following detailed description taken in conjunction with the accompanying drawings, in which:

FIG. 7 is a flowchart illustrating a method of analyzing the layouts of semiconductor integrated circuit devices according to a second embodiment of the present invention;

FIG. 8 is a flowchart illustrating a method of analyzing the layouts of semiconductor integrated circuit devices according to a third embodiment of the present invention;

DESCRIPTION OF THE PREFERRED EMBODIMENTS

Figure 1:
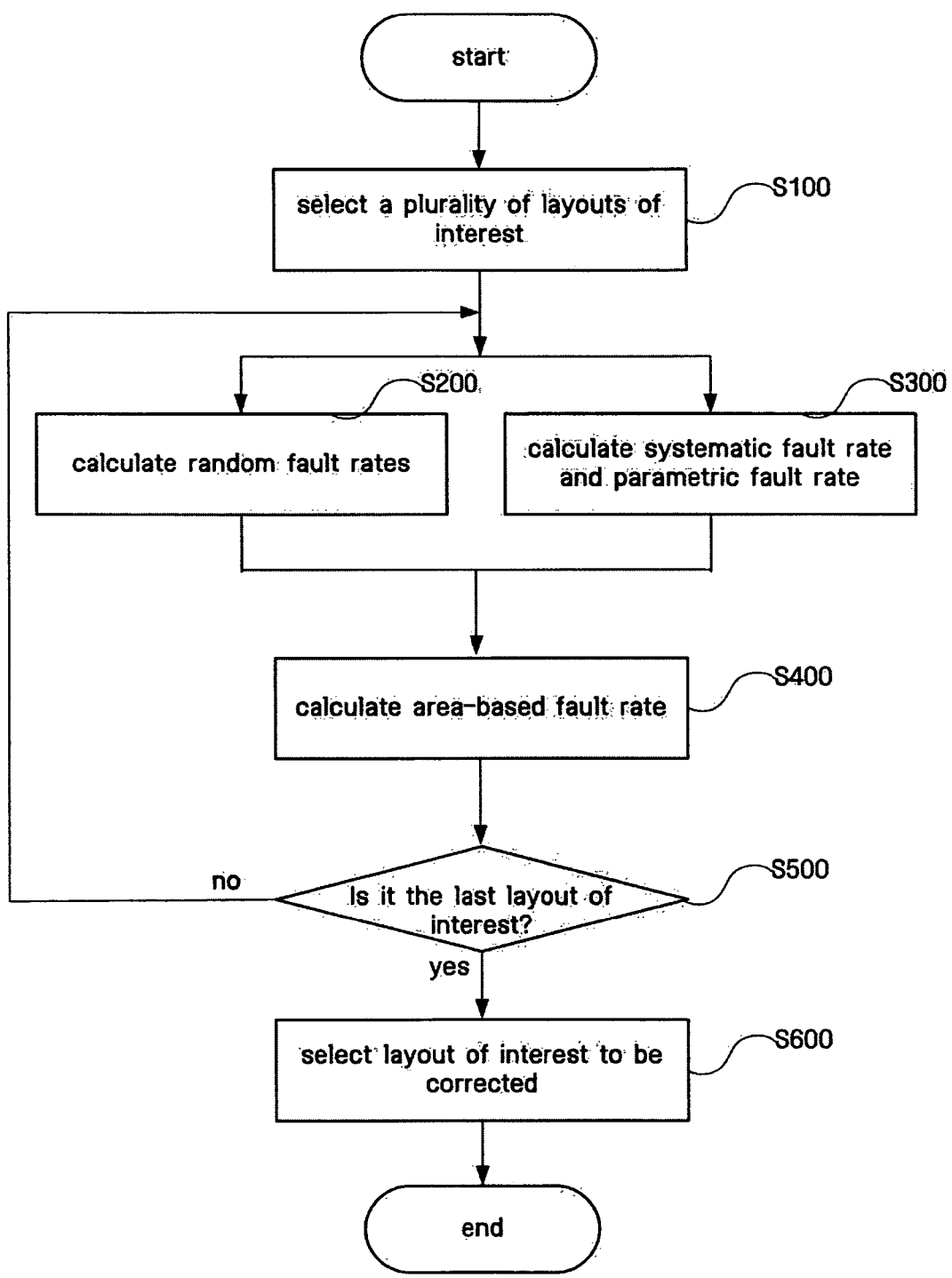
FIG. 1 is a flowchart illustrating a method of analyzing the layouts of semiconductor integrated circuit devices according to a first embodiment of the present invention.

The present invention is described more fully hereinafter with reference to the accompanying drawings, in which preferred embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. Moreover, each embodiment described and illustrated herein includes its complementary conductivity type embodiment as well.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could also be termed a second element, component, region, layer or section without departing from the teachings of the present invention. Similarly, the terms "source" and "drain" are used to distinguish first and second controlling electrodes of a filed effect transistor, so that the designation of "source" and "drain" should not be viewed as limiting. Thus, a source could be termed a drain and vice versa without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants there), when used in this specification, specifies the stated number of features, integers, steps, operations, elements, and/ or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 is a flowchart illustrating a method of analyzing the layouts of semiconductor integrated circuit devices according to a first embodiment of the present invention.

Referring to FIG. 1, first, a plurality of layouts of interest are selected at step S100.

In particular, each of the layouts of interest may be the layout of a cell selected from a standard cell library. The standard cell library is a library of layouts of frequently used circuits provided for convenience of design when the layout of a semiconductor integrated circuit device is designed. The standard cell library can include a layout such as an inverter, a NAND, a flip-flop or the like.

Next, the random fault rate, systematic fault rate and parametric fault rate of each of the layouts of interest are calculated at steps S200 and S300.

In detail, a random fault refers to a fault in which a semiconductor integrated circuit device malfunctions due to a particle generated in manufacturing processes or the like. An example thereof is the case in which a conductive particle falls between two lines, so that a short circuit occurs between the lines.

A systematic fault refers to a fault occurring in the space between two lines or in the minimum enclosure of a line or a via. In these examples, the space between two lines is excessively narrow, so that the lines may be short-circuited, or the line or the via may not be connected to wiring.

A parametric fault refers to a fault in which a desired magnitude parameter is not realized in a manufactured semiconductor integrated circuit device, an example of which may be a fault occurring in the minimum width of an active area. In this example, as the width of the active area increases, variation of a parameter, such as the saturation current or threshold voltage of a transistor, consequently varies.

There are a variety of methods of respectively calculating the fault rates of different types of faults. In the present invention, the measurement of the random fault rate may be performed using Critical Area Analysis (CAA), and the measurements of the systematic fault rate and the parametric fault rate may be performed using Critical Feature Analysis (CFA). CAA is described in detail with reference to FIGS. 2 to 4, and CFA in detail with reference to FIGS. 5 to 6C.

Thereafter, the area-based fault rate of the layout of interest is calculated using the random fault rate, systematic fault rate, parametric fault rate, and area at step S400.

In detail, when cellk is a k-th layout of interest, FaultRatePerSize(cellk) is the area-based fault rate of the k-th layout of interest, rdFR(cellk) is a random fault rate, sysFR(cellk) is a systematic fault rate, paraFR(cellk) is a parametric fault rate, and Size(cellk) is the area of the k-th layout of interest, the area-based fault rate of the k-th layout of interest can be calculated using the following Equation 1:

$$FaultRatePerSize(cellk) = \frac{rdFR(cellk) + sysFR(cellk) + paraFR(cellk)}{Size(cellk)} \quad (1)$$

Meanwhile, in an embodiment of the present invention, the method of calculating the area-based fault rate of a layout of interest is not limited to Equation 1. For example, a method of assigning different weights to a random fault rate, a systematic fault rate and a parametric fault rate based on the degree of interest can be used. When a weight Wk1 is assigned to the random fault rate, a weight Wk2 to the systematic fault rate, and a weight Wk3 to the parametric fault rate, an area-based fault rate can be calculated using the following Equation 2:

$$FaultRatePerSize(cellk) = \frac{Wk1 \times rdFR(cellk) + Wk2 \times sysFR(cellk) + Wk3 \times paraFR(cellk)}{Size(cellk)} \quad (2)$$

Next, whether the last layout of interest is examined is determined, and then the calculation (S200) of a random fault rate, the calculation (S300) of a systematic fault rate and a parametric fault rate and the calculation (S400) of an area-based fault rate are repeatedly performed for each of the remaining layouts of interest. (S500). Exemplary results are summarized in a cell list shown in Table 1.

TABLE 1

| | Random fault rate | Systematic fault rate | Parametric fault rate | Area | Area-based fault rate |
| --- | --- | --- | --- | --- | --- |
| cell1 | 4.288 | 0.097 | 0 | 4.43 | 0.990 |
| cell2 | 2.214 | 1.284 | 0 | 7.38 | 0.474 |
| cell3 | 6.332 | 4.572 | 0.640 | 22.86 | 0.505 |
| cell4 | 2.354 | 0.140 | 0 | 3.69 | 0.676 |
| cell5 | 6.904 | 4.284 | 3.044 | 23.60 | 0.611 |
| cell6 | 3.686 | 0 | 0.102 | 4.43 | 0.855 |
| cell7 | 7.064 | 2.766 | 3.223 | 22.86 | 0.571 |
| cell8 | 1.522 | 0 | 1.156 | 5.16 | 0.519 |

Thereafter, a layout of interest to be corrected is selected from among a plurality of layouts of interest using the area-based fault rates of the plurality of layouts of interest. (S600).

In detail, the selection of the layout of interest to be corrected is carried out by arranging the plurality of area-based fault rates in descending order, and the correction is performed from the layout of interest having the largest area-based fault rate. When the area-based fault rates of FIG. 1 are arranged in descending order, this can be summarized into a cell list as the following Table 2. Referring to Table 1, since the area-based fault rate of a first layout (cell1) of interest is the largest one of 0.990 ppb/μm², the first layout (cell1) of interest is corrected. Next, a sixth layout (cell6) of interest having an area-based fault rate 0.855 ppb/μm² can be corrected.

TABLE 2

| | Random fault rate | Systematic fault rate | Parametric fault rate | Area | Area-based fault rate |
| --- | --- | --- | --- | --- | --- |
| Cell1 | 4.288 | 0.097 | 0 | 4.43 | 0.990 |
| Cell6 | 3.686 | 0 | 0.102 | 4.43 | 0.855 |
| Cell4 | 2.354 | 0.140 | 0 | 3.69 | 0.676 |
| Cell5 | 6.904 | 4.284 | 3.044 | 23.60 | 0.611 |
| Cell7 | 7.064 | 2.766 | 3.223 | 22.86 | 0.571 |
| Cell8 | 1.522 | 0 | 1.156 | 5.16 | 0.519 |
| Cell3 | 6.332 | 4.572 | 0.640 | 22.86 | 0.505 |
| Cell2 | 2.214 | 1.284 | 0 | 7.38 | 0.474 |

In this embodiment of the present invention, although the cell list in which the area-based fault rates of 8 layouts of interest are arranged in descending order is taken as an example, a standard cell list in which the area-based fault rates of all cell layouts included in a standard cell library are arranged in descending order also is included in the spirit of the present invention.

Although not shown in the drawings, a mask manufactured using the method of analyzing the layouts of semiconductor integrated circuit devices described above with reference to FIG. 1 belongs within the technical spirit of the present invention.

Furthermore, a semiconductor integrated circuit device manufactured using the mask also belongs within the technical spirit of the present invention.

Figure 2:
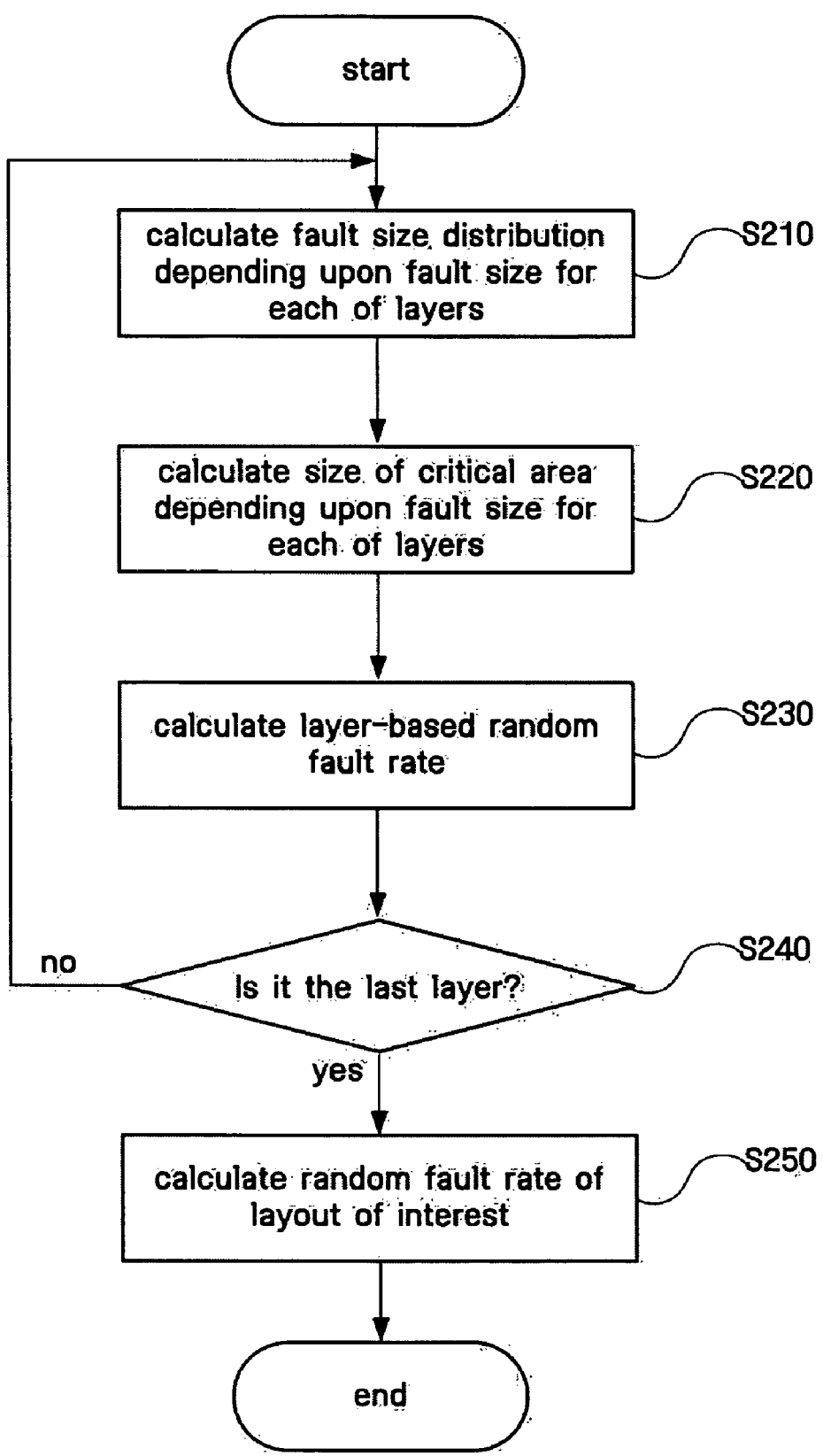
FIG. 2 is a flowchart illustrating step S200 of FIG. 1 in detail.

A method of calculating the random fault rate of a layout of interest is described with reference to FIGS. 2, 3A to 3C, and 4 below. FIG. 2 is a flowchart illustrating block S200 of FIG. 1 in detail, FIGS. 3A to 3C are diagrams illustrating each of the steps of FIG. 2, and FIG. 4 is a conceptual diagram illustrating a critical area.

Figure 3A:
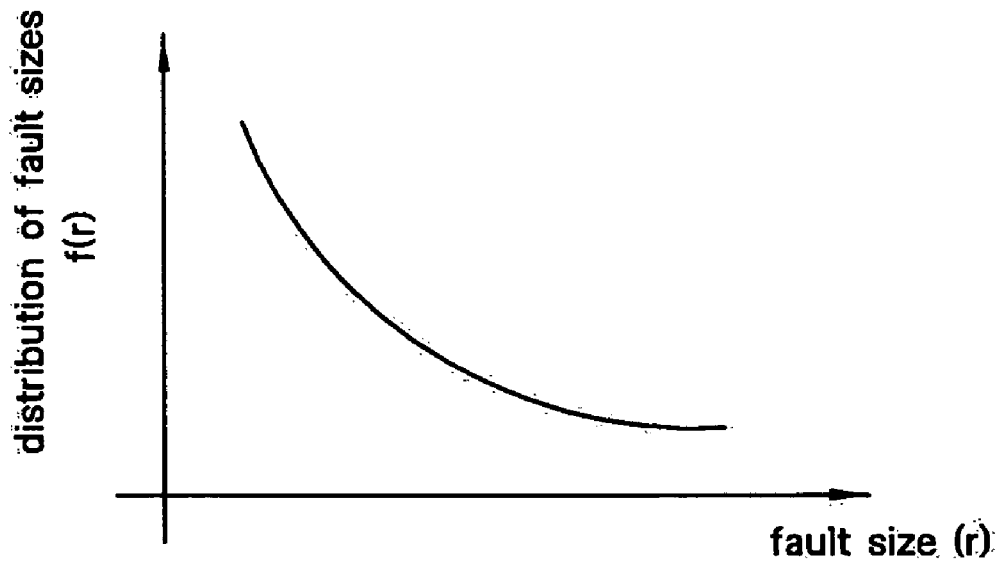
FIGS. 3A to 3C are diagrams illustrating respective steps of FIG. 2.
Figure 3B:
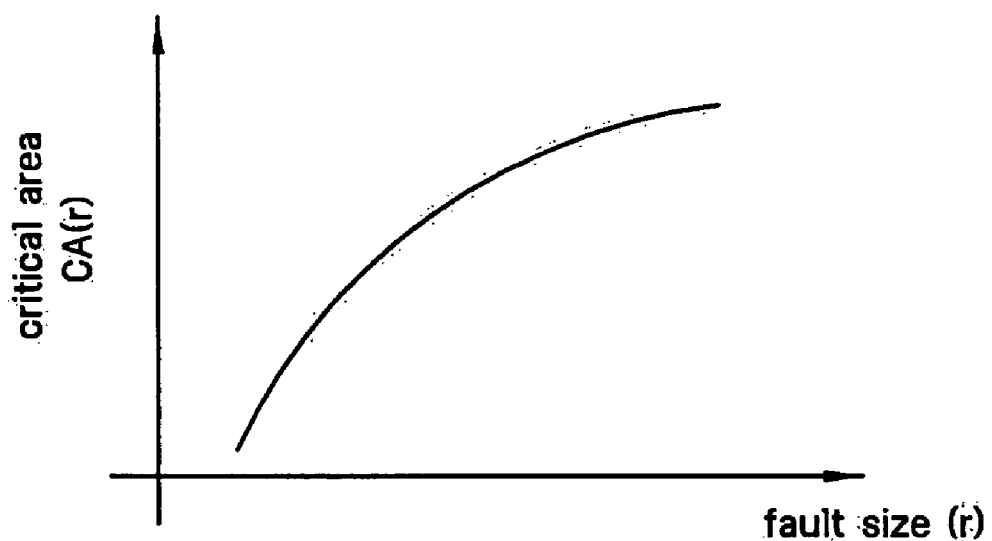
Figure 3C:
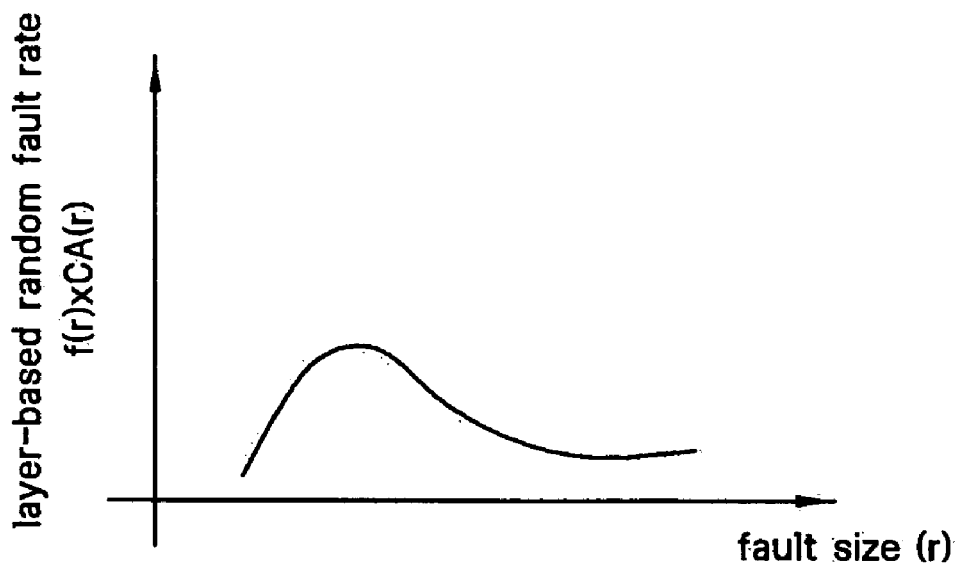
Figure 4:
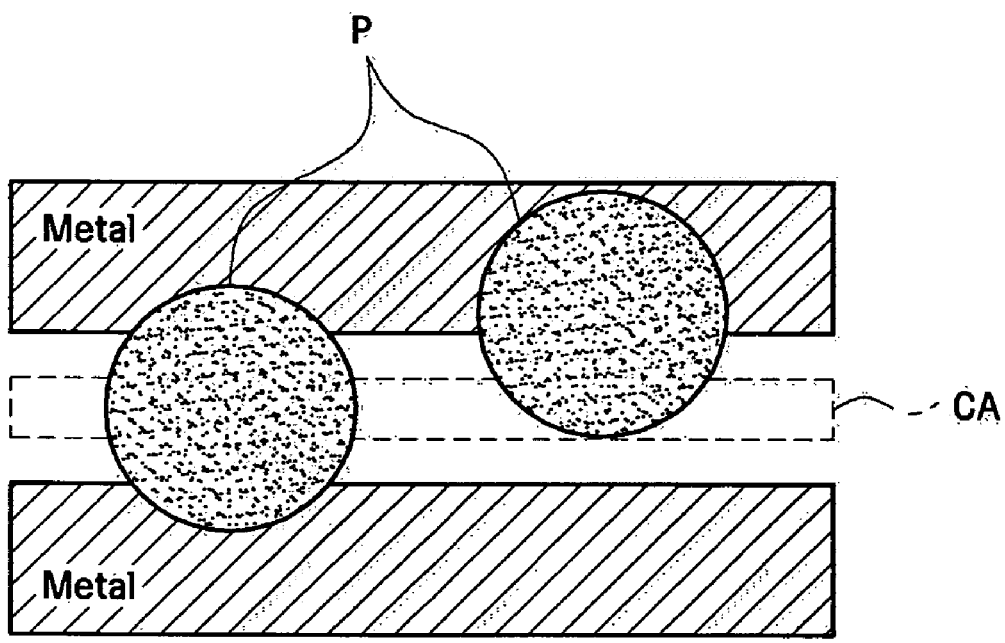
FIG. 4 is a conceptual diagram illustrating a critical area.

Referring to FIG. 2, a fault size distribution depending upon the sizes of faults is calculated for each layer of a layout of interest, an example of which is illustrated in FIG. 3A. In FIG. 3A, the x axis represents a fault size (r), and the y axis represents the distribution f(r) of the fault sizes. In this case, the fault size (r) can be defined as the radius of a particle. The reason for this is that it can be assumed that a particle which may be generated during a process of manufacturing a semiconductor integrated circuit device is circular.

In this case, the layers are respective layers formed on a semiconductor integrated circuit device, and may include an active layer, a gate-poly layer, a contact layer, a metal layer, and a via layer.

Next, the size of a critical area based on the fault size is calculated for each of the layers of the layout of interest at step S220.

In detail, as in FIG. 4, a Critical Area (CA) can be defined as an area in which a conductive particle P, generated during a semiconductor manufacturing process, falls between two metal lines, whereby the metal lines may be short-circuited. Therefore, as the size of the conductive particle P increases, the size of the critical area CA increases. The relationship thereof may be illustrated as in FIG. 3B. In this case, the x axis represents the fault size (r), and the y axis represents the size CA(r) of the critical area.

Thereafter, layer-based random fault rates of layouts of interest are calculated at step S230.

In detail, when $D_0$ is the fault density of a layer, the layer-based random fault rate of the h-th layer of a k-th layout of interest can be calculated as Equation 3. FIG. 3C is acquired by multiplying CA(r) of FIG. 3A by f(r) of FIG. 3B, and a layer-based random fault rate is the area between CA(r)f(r), and the x axis illustrated in FIG. 3C.

$$LayerFR(cellk)h = \int D_0 CA(r) f(r) dr \quad (3)$$

Next, whether the last layer of the layout of interest is examined is determined, and then the calculation (S210) of a fault distribution depending upon fault size for each of the layers, the calculation (S220) of the size of a critical area depending upon fault size for each of the layers, and the calculation (S230) of a layer-based random fault rate are repeatedly performed for each of the un-examined layers. (S240).

Next, the random fault rate of the layout of interest is calculated using the layer-based fault rates. (S250).

In detail, when the layout of interest is composed of one layer, the random fault rate can be calculated using Equation 4:

$$rdFR(cellk) = \sum_{h=1}^{l} LayerFR(cellk)h \quad (4)$$

In Equation 4, the layer-based random fault rates are simply summed, but embodiment of the present invention are not limited to this. For instance, a method of assigning different weights to the layer-based random fault rates depending on the degree of interest may be used.

A method of calculating the systematic fault rate and parametric fault rate of a layout of interest is described below with reference to FIGS. 5 and 6A to 6C.

Figure 5:
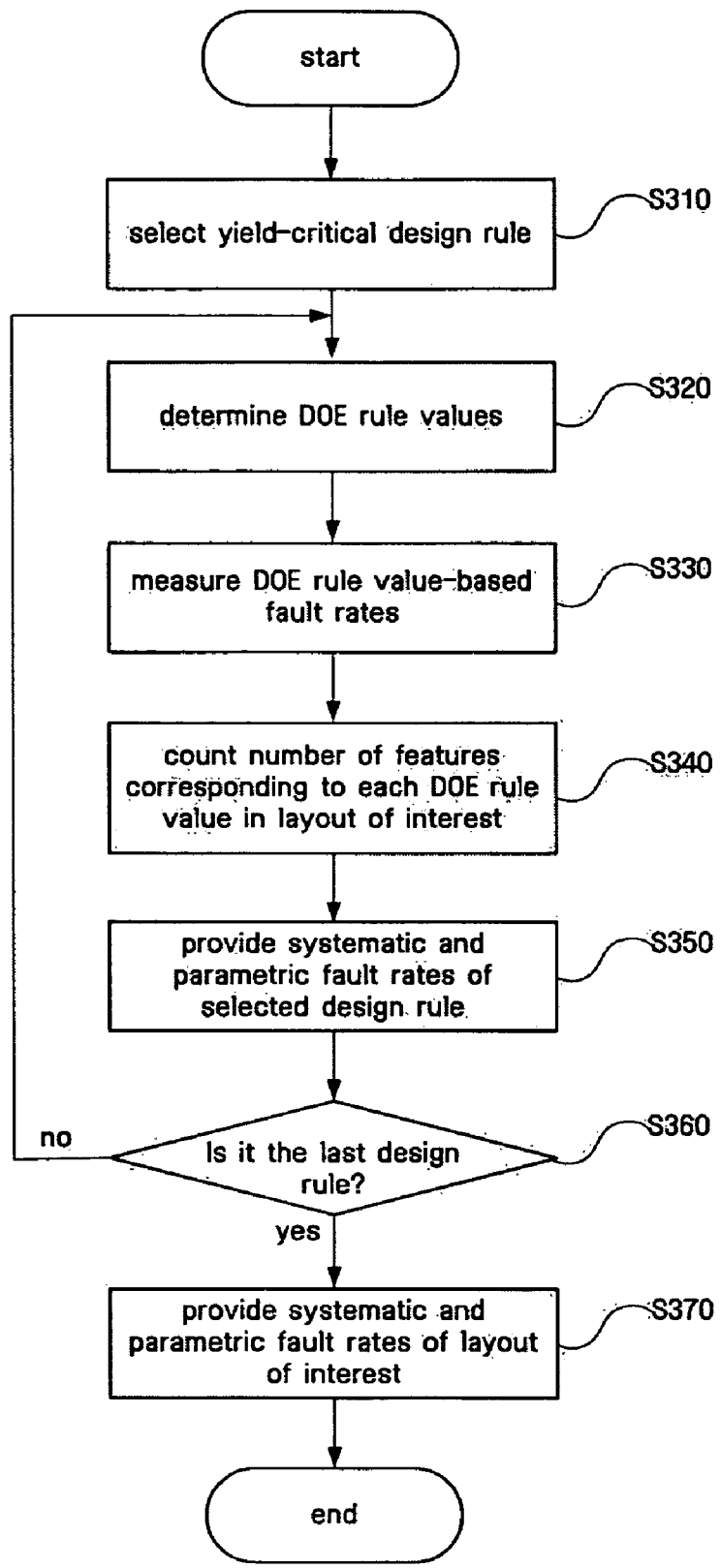
FIG. 5 is a flowchart illustrating step S300 of FIG. 1 in detail.

Referring to FIG. 5, one or more yield-critical design rules (for example, m design rules, where m≧1) which decisively affect yield, are selected from among a plurality of design rules included in a set of design rules. (S310).

In detail, in order to design the layout of a semiconductor integrated circuit device, a set of design rules is used. The set of design rules includes a plurality of design rules, for example, the space between two lines, the width of a line, the minimum width of an active area, the minimum enclosure of a contact or a via, or the like. The yield-critical design rules, that is, the design rules that may decrease the yield of a wafer when strictly followed, are selected from among the plurality of design rules.

In this case, selecting the yield-critical rules is selectively performed, and operations following block S310 may be applied to all design rules included in the set of design rules.

Next, one or more Design Of Experiment (DOE) rule values (for example, n DOE rule values, where n≧1) for the selected design rule are determined. (S320).

In detail, the plurality of DOE rule values may be taken at increments of a predetermined interval from a Minimum Design Rule value (MDR). In this case, the predetermined interval may be a design grid or a multiple of the design grid.

For example, when the selected design rule is the space between two lines, the minimum design rule value is 0.04 μm, and the design grid is 0.01 μm, the determined DOE rule values may be values acquired at increments of 0.01 μm between 0.04 μm and 0.11 μm. Meanwhile, the largest (that is, 0.11 μm) of the plurality of DOE rule values may be a value that allows the space between two lines to be sufficiently wide to generate few faults, and can be predicted from past experience.

Thereafter, a plurality of DOE rule value-based fault rates is measured at step S330.

In particular, test patterns representing the selected design rule are formed on a wafer for each of the plurality of DOE rule values. Thereafter, the number of the test patterns in which a fault occurs is counted for each of the plurality of DOE rule values.

For example, when the test pattern representing the space between lines, which is the selected design rule, is formed on a wafer, a predetermined number of test patterns is formed for each of the plurality of DOE rule values (in increments of 0.01 μm from 0.04 μm to 0.11 μm). Thereafter, the number of test patterns in which a fault occurs is counted for each of the plurality of DOE rule values, thereby calculating the DOE rule value-based fault rates.

Figure 6A:
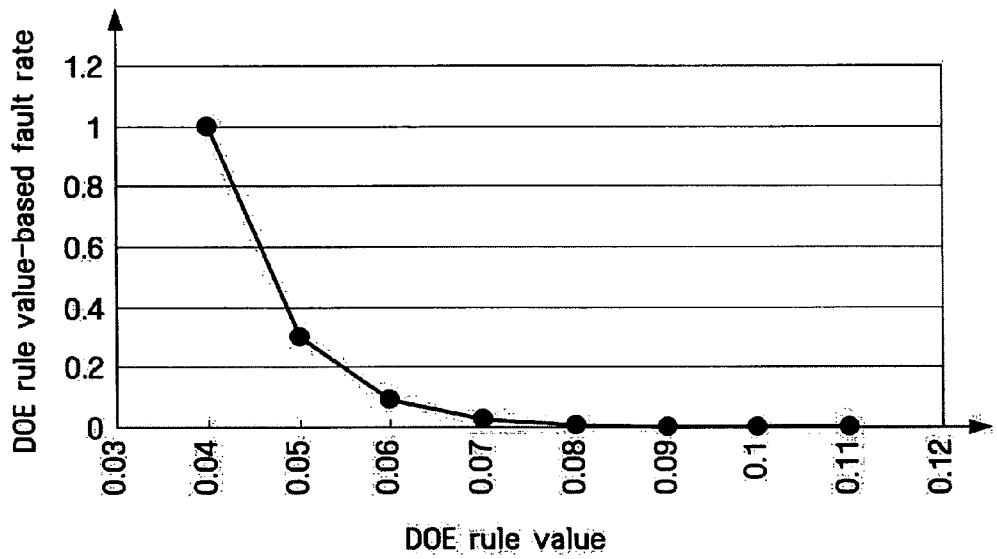
FIGS. 6A to 6C are diagrams illustrating respective steps of FIG. 5.

The calculated DOE rule value-based fault rates are illustrated in FIG. 6A. The x axis represents DOE rule values, and the y axis represents the DOE rule value-based fault rates. When the minimum design rule value is 0.04 μm, the DOE rule value-based fault rate is about 1 ppb (part per billion), and, when the minimum design rule value is 0.05 μm, the DOE rule value-based fault rate is about 0.3 ppb. It can be seen that the DOE rule value-based fault rate gets smaller as the DOE rule value increases.

Meanwhile, for selected design rules, only a systematic fault, only a parametric fault, or both a systematic fault and a parametric fault may be generated according to their characteristics.

A systematic fault is a fault chiefly occurring in the space between two lines, or in the minimum enclosure of a line or a via. In these examples, the space between two lines is too narrow, so that the lines may short-circuited to each other, or the line or the via may not be connected to wiring. A parametric fault is a fault in which a parameter having a desired value is not realized in a manufactured semiconductor integrated circuit device, an example of which may be a fault occurring in the minimum width of an active area. In this example, as the width of the active area increases, the value of a parameter, such as the saturation current or threshold voltage of a transistor, varies.

Therefore, in the case of the parametric fault, a method of measuring a plurality of DOE rule value-based fault rates may be somewhat different from that for the systematic fault. That is, the parametric fault may be determined not to reach a predetermined target parameter value after the selection of the predetermined target parameter value. For example, in the case in which the target parameter value of the saturation current of a transistor is determined to be 1 mA, when the saturation current become higher than 1 mA, it can be determined that a fault has occurred in a selected design rule (that is, the width of an active area). However, the method of measuring a fault rate related to the parametric fault is not limited to the above-described method.

Next, the number of features corresponding to each of the DOE rule values within a layout of interest is counted. (S340).

Figure 6B:
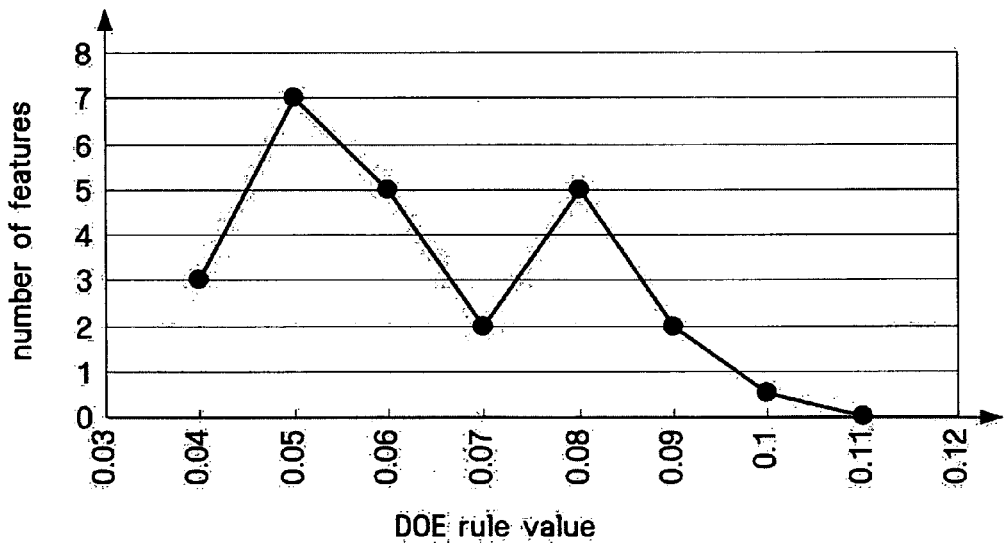

In this case, the number of features corresponding to each of the DOE rule values (that is, values taken at increments of 0.01 μm from 0.04 μm to 0.11 μm) within the layout of interest is counted, the result of which is illustrated in FIG. 6B. The x axis represents the DOE rule values (DOE), and the y axis represents the numbers of features. For example, it can be known that the number of features is 3 for 0.04 μm, which is the minimum design rule within the layout of interest, and the number of features is 7 for 0.05 μm.

Thereafter, the systematic fault rates and parametric fault rates of design rules selected using the DOE rule value-based fault rates and the numbers of features are provided. (S350).

When a systematic fault is generated in an i-th design rule, the systematic fault rate thereof may be calculated using Equation 5. When a parametric fault is generated in the i-th design rule, the parametric fault rate thereof may be calculated using Equation 6. In these equations, the i-th design rule is rulei, the systematic fault rate of the i-th design rule is sysFR(rulei), the parametric fault rate of the i-th design rule is paraFR(rulei), the number of a plurality of DOE rule values is n, the fault rate of a j-th DOE rule value for the i-th design rule is DOEFR(rulei)j, and the number of features corresponding to the j-th DOE rule value for the i-th design rule is COUNT (rulei)j.

$$sysFR(rulei) = \sum_{j=1}^{n} \{DOEFR(rulei)j \times COUNT(rulei)j\} \quad (5)$$

$$paraFR(rulei) = \sum_{j=1}^{n} \{DOEFR(rulei)j \times COUNT(rulei)j\} \quad (6)$$

Figure 6C:
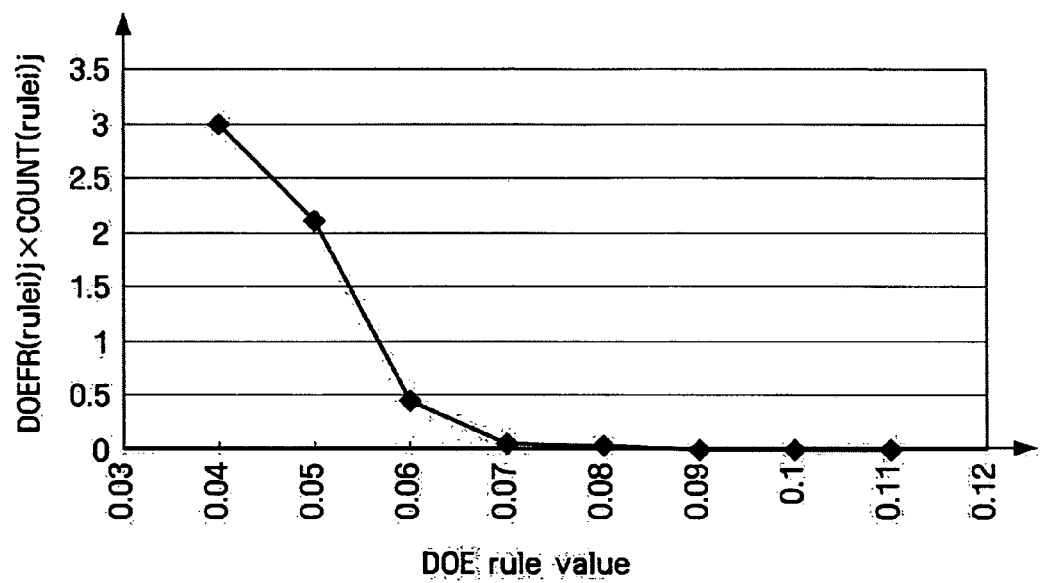

For example, when the selected design rule is the space of two lines, the DOE rule value-based fault rates of FIG. 6A and the numbers of features of FIG. 6B are multiplied with each other, thereby calculating DOEFR(rulei)j×COUNT(rulei)js as shown in FIG. 6C. Thereafter, the calculated DOEFR(rule) ij×COUNT(rulei)js are summed, so that the systematic fault rate sysFR(rulei)) of the i-th design rule can be calculated.

Meanwhile, in an embodiment of the present invention, the methods of respectively acquiring the systematic and parametric fault rates of design rules are not limited to Equations 5 and 6. For instance, a method of assigning different weights to the DOE rule value-based fault rates that are of particular interest and to the DOE rule value-based fault rates that are not of particular interest may be used. For example, the fault rate of the DOE rule value of 0.04 μm, which may occur in the minimum design rule value) has a great effect on the yield, therefore it is assigned a weight larger than those of the fault rates of other DOE rule values.

Next, whether the last yield-critical design rule is examined is determined, and blocks S320 to S350 (the operation of determining DOE rule values, the operation of measuring the DOE rule value-based fault rates, the operation of counting the number of features corresponding to each of the DOE rule values within the layout of interest, and the operation of providing the systematic and parametric fault rates of selected design rules) are repeatedly performed for each of the un-examined design rules. (S360).

Thereafter, the systematic and parametric fault rates of the layout of interest are respectively corrected using the systematic and parametric fault rates of selected design rules. (S370).

$$sysFR(cellk) = \sum_{i=1}^{n} sysFR(rulei) \quad (7)$$

$$paraFR(cellk) = \sum_{i=1}^{n} paraFR(rulei) \quad (8)$$

In Equations 7 and 8, the systematic fault rates and parametric fault rates of selected design rules are simply summed, but the present invention is not limited to this. For example, a method of assigning different weights to the systematic fault rate and parametric fault rate of each design rule depending on the degree of interest can be used.

FIG. 7 is a flowchart illustrating a method of analyzing the layouts of semiconductor integrated circuit devices according to a second embodiment of the present invention. The same reference numerals are used for components that are substantially the same as in FIG. 1, thus detailed descriptions thereof are omitted.

The second embodiment of the present invention calculates a fault rate which may be generated in a layout of interest within a semiconductor integrated circuit device, and determines whether the fault rate of a specific layout of interest is higher than those of the others, or selects layouts of interest to be corrected within the semiconductor integrated circuit device.

Referring to FIG. 7, first, a plurality of layouts of interest is selected at step S100. Some or all of the standard cells used within a semiconductor integrated circuit device may be selected.

Next, the random fault rate, systematic fault rate and parametric fault rate of each of the layouts of interest are calculated. (S200 and S300).

Thereafter, total fault rates of the layouts of interest are calculated using the random fault rates, the systematic fault rates and the parametric fault rates. (S410). In detail, the total fault rate of each layout of interest can be calculated simply by summing the random fault rate, the systematic fault rate and the parametric fault rate thereof, or by assigning weights thereto and summing them.

Next, the usage frequency of the layout of interest within the semiconductor device is counted. (S420).

The fault rate which may be generated by a layout of interest within the semiconductor integrated circuit device is calculated by multiplying the total fault rate of the layouts of interest by the frequency corresponding to the layout of interest. (S430).

Next, whether the last layout of interest is examined is determined, and blocks S200 to S430 are repeatedly performed for each of the other un-examined layouts of interest. (S500). The result is summarize into a cell list as Table 3.

TABLE 3

| | Random fault rate | Systematic fault rate | Parametric fault rate | Frequency | Possible fault rate in device |
|---|---|---|---|---|---|
| cell1 | 4.288 | 0.097 | 0 | 13 | 57.005 |
| cell2 | 2.214 | 1.284 | 0 | 1785 | 6243.93 |
| cell3 | 6.332 | 4.572 | 0.640 | 8 | 92.352 |
| cell4 | 2.354 | 0.140 | 0 | 45 | 112.23 |
| cell5 | 6.904 | 4.284 | 3.044 | 352 | 4996.992 |
| cell6 | 3.686 | 0 | 0.102 | 8 | 30.304 |
| cell7 | 7.064 | 2.766 | 3.223 | 8 | 104.424 |
| cell8 | 1.522 | 0 | 1.156 | 11 | 29.458 |

Thereafter, the fault rates which may be generated by the layouts of interest within the semiconductor integrated circuit device are arranged in descending order, and layouts of interest to be corrected can be selected in consideration of the arrangement order. Table 4 is the result in which the fault rates which may be generated by the layouts of interest within the semiconductor integrated circuit device are arranged in descending order. Referring to Table 4, since the fault rate of the second layout (cell2) of interest is the largest one, of 6243.93 ppb, the second layout (cell1) of interest is connected. Next, the fifth layout (cell5) of interest can be corrected.

TABLE 4

| | Random fault rate | Systematic fault rate | Parametric fault rate | Frequency | Possible fault rate in device |
|---|---|---|---|---|---|
| cell2 | 2.214 | 1.284 | 0 | 1785 | 6243.93 |
| cell5 | 6.904 | 4.248 | 3.044 | 352 | 4996.992 |
| cell4 | 2.354 | 0.140 | 0 | 45 | 112.23 |
| cell7 | 7.064 | 2.766 | 3.223 | 8 | 104.424 |

TABLE 4-continued

| | Random fault rate | Systematic fault rate | Parametric fault rate | Frequency | Possible fault rate in device |
|---|---|---|---|---|---|
| cell3 | 6.332 | 4.574 | 0.640 | 8 | 92.352 |
| cell1 | 4.288 | 0.097 | 0 | 13 | 57.005 |
| cell6 | 3.686 | 0 | 1.102 | 8 | 30.304 |
| cell8 | 1.522 | 0 | 1.156 | 11 | 29.458 |

Although not shown in the drawings, a mask manufactured using the method of analyzing the layouts of semiconductor integrated circuit devices described above with reference to FIG. 7 belongs within the technical spirit of the present invention.

Furthermore, a semiconductor integrated circuit device manufactured using the mask also belongs within the technical spirit of the present invention.

FIG. 8 is a flowchart illustrating a method of analyzing the layouts of semiconductor integrated circuit devices according to a third embodiment of the present invention. The same reference numerals are used for components that are substantially the same as in FIG. 1, thus detailed descriptions thereof are omitted.

The third embodiment of the present invention divides a semiconductor integrated circuit device into a plurality of circuit blocks and calculates the fault rate and yield for each of the circuit blocks, thereby determining whether the fault rate of a specific circuit block is higher than those of the others.

Referring to FIG. 8, a semiconductor integrated circuit device can be divided into a plurality of circuit blocks. (S110).

Figure 9:
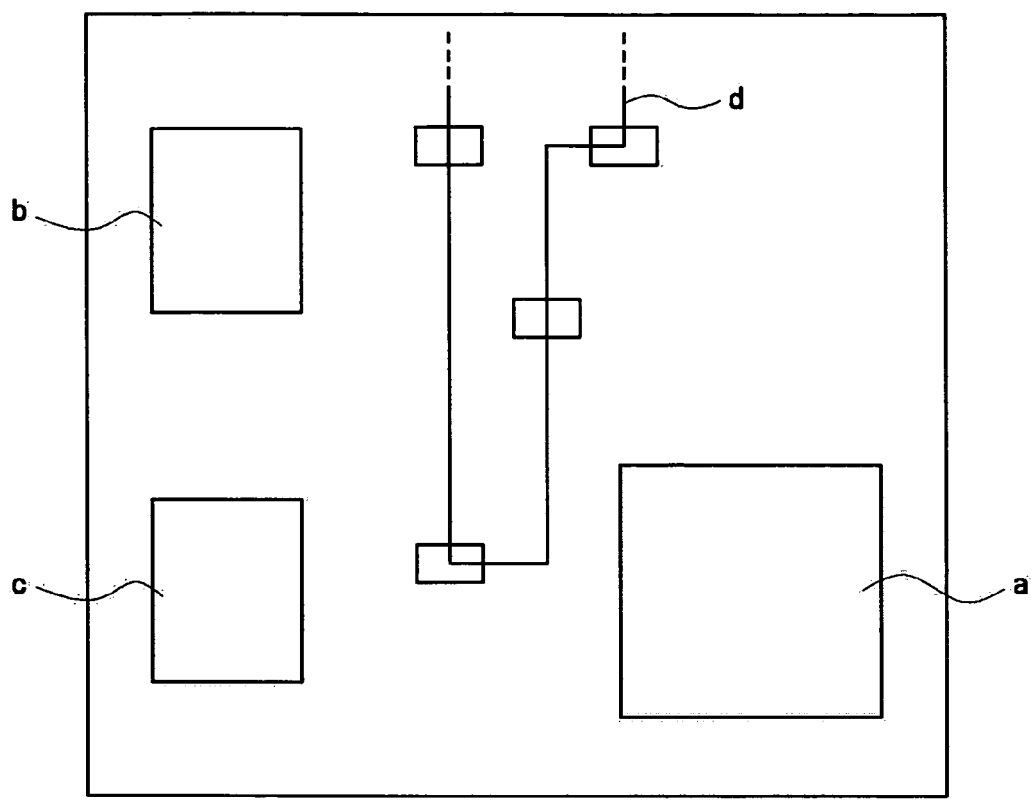
FIG. 9 is a conceptual diagram in which a semiconductor integrated circuit device is divided into a plurality of circuit blocks.

For example, the semiconductor integrated circuit device, as illustrated in FIG. 9, may be divided into a plurality of circuit blocks including a memory block a, such as SRAM or DRAM for storing data, a functional block b, such as USB or MPEC, for performing a specific function, a block c formed as another standard cell, and a routing block for coupling a plurality of elements.

Next, at least one of the random fault rate, the systematic fault rate and the parametric fault rate is calculated for each of the circuit blocks. (S200 and S300). Thereafter, whether the last circuit block is examined is determined, and then blocks S200 and S300 are repeatedly performed for the other unexamined circuit blocks. (S510).

The random fault rate, the systematic fault rate and the parametric fault rate can be calculated according to the same method, or a method similar to the method described for the second embodiment of the present invention. The reason for this is that the memory block a and the functional block b are only large blocks for performing a specific function, and are the same as formed using standard cells, and the routing block d is a block in which a specific design rule (for example, the space between two lines or the width of a line) is mainly used.

Thereafter, a yield-critical circuit block that decisively affects the yield of semiconductor integrated circuit devices is selected using the calculated random fault rates, the systematic fault rates and the parametric fault rates of the respective circuit blocks. (S610).

In detail, in the third embodiment of the present invention, the yields are calculated using the random fault rates, the systematic fault rates and the parametric fault rates for the respective circuit blocks, and a yield-critical circuit block is selected in consideration of the yields. Also, it is possible to select a yield-critical circuit block in consideration of the random fault rates, the systematic fault rates and the parametric fault rates.

For example, yield based on the systematic fault rate of a memory block can be calculated using a Poisson model as in Equation 9. In this case, $C_{Yield}$ ($0 \leq C_{yield} \leq 1$) is a yield constant which represents variation in yield occurring for reasons other than the above-described variation in the yield due to the design rule, and sysFR(memoryBLK) represents the systematic fault rate of a memory block.

$$\text{Yield} = C_{Yield} \times \exp(-sysFR(\text{memoryBLK})) \quad (9)$$

Although the method of calculating yield using the Poisson model is taken as an example in the method of analyzing the layouts of semiconductor integrated circuit devices according to the third embodiment of the present invention, one of ordinary skill in the art will appreciate that it is possible to calculate yield using another model, such as a negative binomial model.

The result of the calculation of yields for respective circuit blocks is summarized into Table 5. Referring to Table 5, yields based on the random fault rates were calculated only for memory blocks, and yields based on the systematic fault rates and yields based on parametric fault rates were not calculated. Furthermore, the yield of the parametric fault rate of the routing block was the lowest one, of 93%, so that a circuit block, which decisively affects the yield of semiconductor integrated circuit devices, is the routing block. As a result, the portion relative to a parametric fault rate of the routing block is corrected first.

TABLE 5

| | Circuit blocks | Yield (%) |
|---|---|---|
| Random fault rate | Standard cell block | 99 |
| | Routing block | 98 |
| | Memory block | 97 |
| Systematic fault rate | Standard cell block | 96 |
| | Routing block | 95 |
| Parametric fault rate | Standard cell block | 94 |
| | Routing block | 93 |
| Total fault rate | | 75 |

Figure 10:
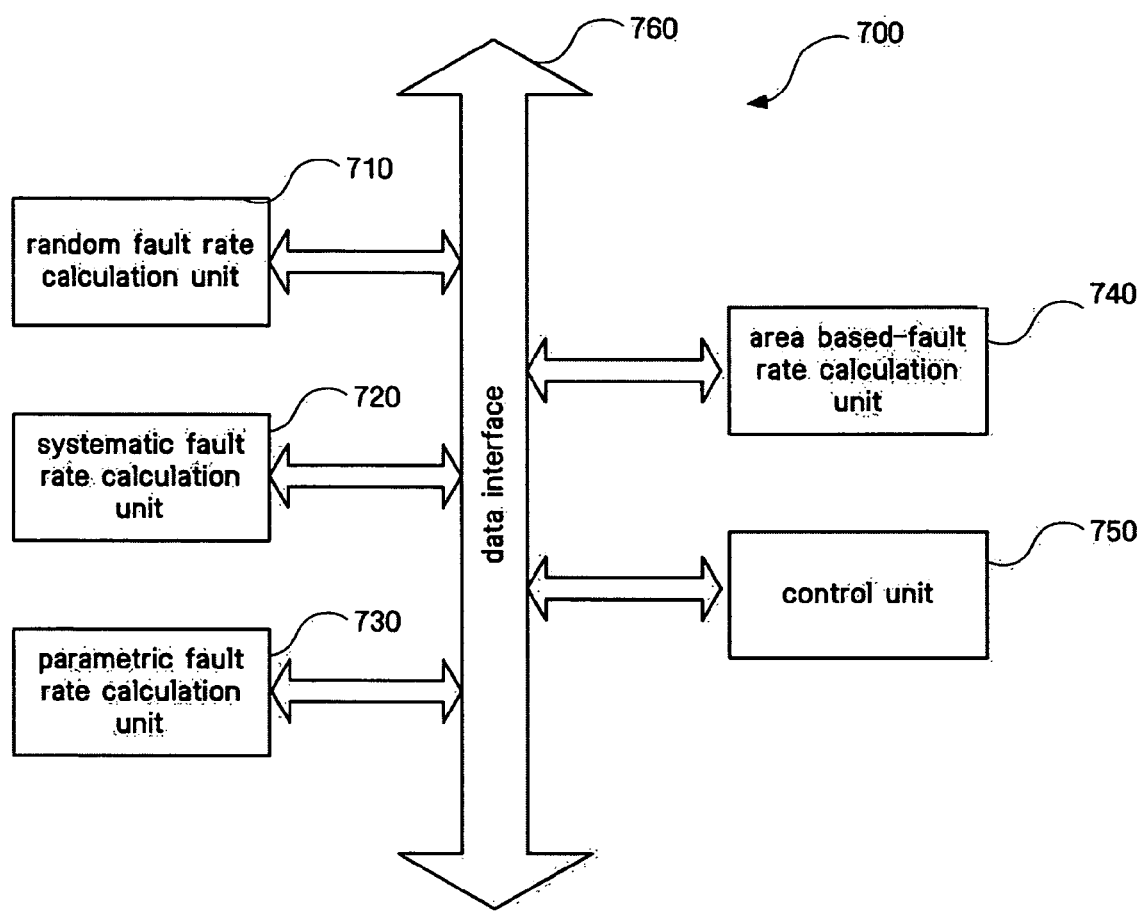
FIG. 10 is a flowchart illustrating a system for analyzing the layouts of semiconductor integrated circuit devices according to a first embodiment of the present invention.

FIG. 10 is a flowchart illustrating a system for analyzing the layouts of semiconductor integrated circuit devices according to a first embodiment of the present invention.

Referring to FIG. 10, the system 700 of analyzing the layouts of semiconductor integrated circuit devices according to the first embodiment of the present invention is for implementing the method of analyzing the layouts of semiconductor integrated circuit devices according to the first embodiment of the present invention. The system 700 includes a random fault rate calculation unit 710, a systematic fault rate calculation unit 720, a parametric fault rate calculation unit 730, an area based-fault rate calculation unit 740, and a control unit 750. The respective units can communicate with each other through a data interface 760 or another communication link.

The random fault rate calculation unit 710 calculates random fault rates of a plurality of layouts of interest. The systematic fault rate calculation unit 720 calculates systematic fault rates of the plurality of layouts of interest. The parametric fault rate calculation unit 730 calculates parametric fault rates of the plurality of layouts of interest. The area-based fault rate calculation unit 740 receives random fault rates, systematic fault rates, and parametric fault rates from the random fault rate calculation unit 710, the systematic fault rate calculation unit 720, and the parametric fault rate calculation unit 730, and calculates the plurality of area-based fault rates of the layouts of interest. The control unit 750 receives the plurality of area-based fault rates of the layouts of interest, arranges them in descending order, and selects layouts of interest to be corrected from among the plurality of area-based fault rates in consideration of the arrangement order.

Figure 11:
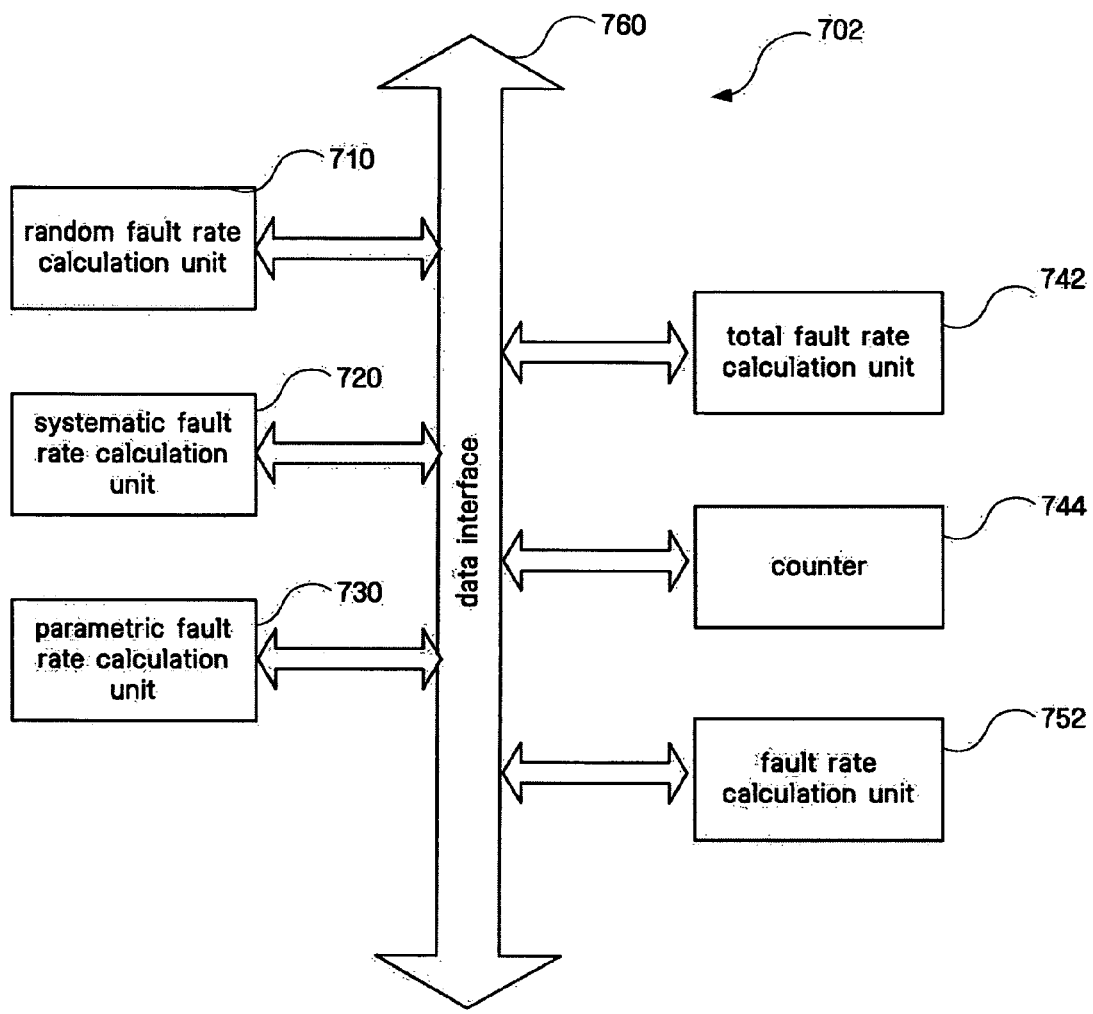
FIG. 11 is a flowchart illustrating a system for analyzing the layouts of semiconductor integrated circuit devices according to a second embodiment of the present invention.

FIG. 11 is a flowchart illustrating a system for analyzing the layouts of semiconductor integrated circuit devices according to a second embodiment of the present invention. The same reference numerals are used for components that are substantially the same as in FIG. 10, thus detailed descriptions thereof are omitted.

Referring to FIG. 11, the system 702 of analyzing the layouts of semiconductor integrated circuit devices according to the second embodiment of the present invention is for implementing the method of analyzing the layouts of semiconductor integrated circuit devices according to the second embodiment of the present invention. The system 702 includes a random fault rate calculation unit 710, a systematic fault rate calculation unit 720, a parametric fault rate calculation unit 730, a total fault rate calculation unit 742, a counter 744, and a fault rate calculation unit 752. The respective units can communicate with each other through a data interface 760 or another communication link.

The total fault rate calculation unit 742 receives random fault rates, systematic fault rates, and parametric fault rates from the random fault rate calculation unit 710, the systematic fault rate calculation unit 720 and the parametric fault rate calculation unit 730, and calculates total fault rates by summing them.

The counter 744 counts the respective usage frequencies of the layouts of interest within a semiconductor integrated circuit device.

The fault rate calculation unit 752 calculates fault rates which may be generated by the layouts of interest within the semiconductor integrated circuit device by multiplying the total fault rates of the layouts of interests by the frequencies corresponding to the layouts of interest.

Figure 12:
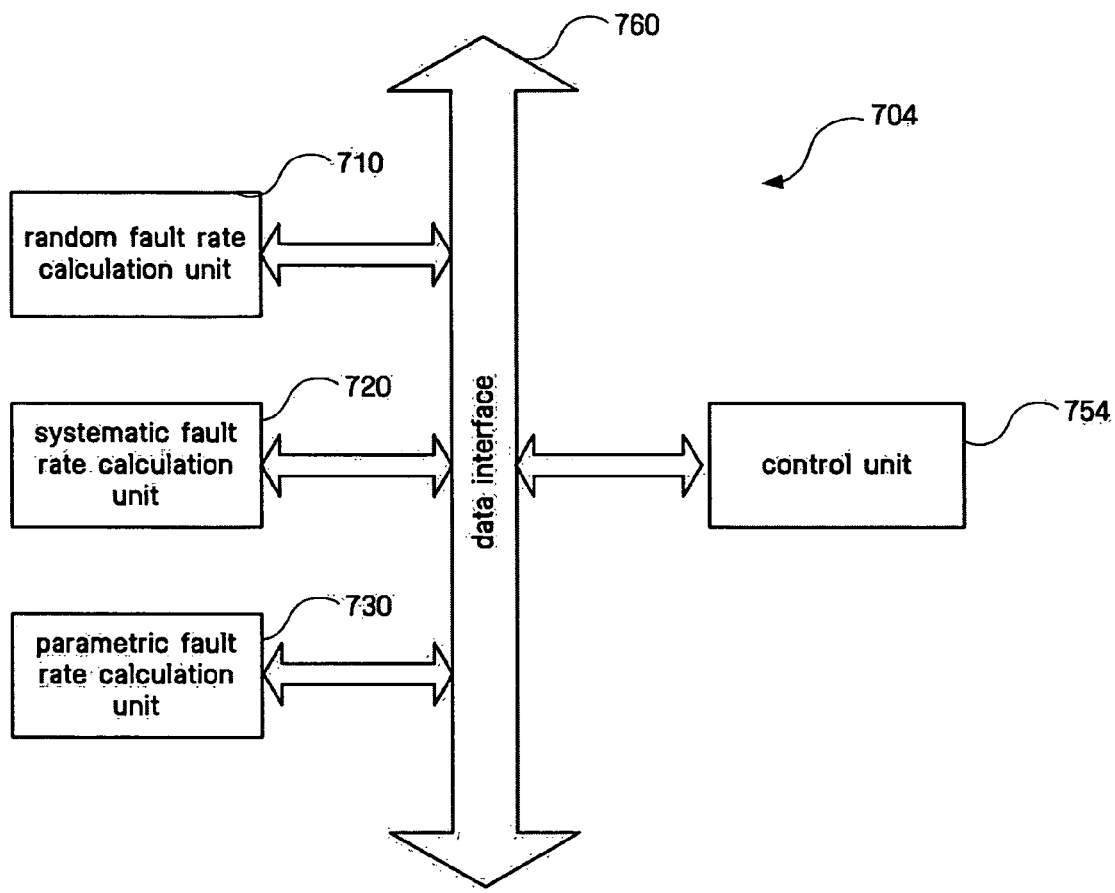
FIG. 12 is a flowchart illustrating a system for analyzing the layouts of semiconductor integrated circuit devices according to a third embodiment of the present invention.

FIG. 12 is a flowchart illustrating a system for analyzing the layouts of semiconductor integrated circuit devices according to a third embodiment of the present invention. The same reference numerals are used for components that are substantially the same as in FIG. 10, thus detailed descriptions thereof are omitted.

Referring to FIG. 12, the system 704 for analyzing the layouts of semiconductor integrated circuit devices according to the third embodiment of the present invention is for implementing the method of analyzing the layouts of semiconductor integrated circuit devices according to the third embodiment of the present invention. The system 704 includes a random fault rate calculation unit 710, a systematic fault rate calculation unit 720, a parametric fault rate calculation unit 730, and a control unit 754. The respective units can communicate with each other through a data interface 760 or another communication link.

The random fault rate calculation unit 710, the systematic fault rate calculation unit 720, and the parametric fault rate calculation unit 730 respectively calculate random fault rates, systematic fault rates, and parametric fault rates for the plurality of circuit blocks of a semiconductor integrated circuit device.

The control unit 754 receives the random fault rates, the systematic fault rates, and the parametric fault rates from the random fault rate calculation unit 710, the systematic fault rate calculation unit 720, and the parametric fault rate calculation unit 730, and calculates yields based on the random fault rates, yields based on the systematic fault rates, and yields based on the parametric fault rates, for the respective circuit blocks.

Although not shown in the drawings, a mask manufactured using any one of the systems for analyzing the layouts of semiconductor integrated circuit devices described above with reference to FIGS. 10 to 12 belongs within the technical spirit of the present invention.

Furthermore, a semiconductor integrated circuit device manufactured using the mask also belongs within the technical spirit of the present invention.

According to the above-described methods and systems for analyzing the layout of semiconductor integrated circuit devices, it is possible to maximize yield by calculating random fault rates, systematic fault rates, and parametric fault rates of layouts of interest and correcting the layouts of interest using them.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of analyzing layouts of semiconductor integrated circuit devices, the method comprising the following steps performed by a system having a random fault rate calculation unit, a systematic fault rate calculation unit, a parametric fault rate calculation unit, an area based-fault rate calculation unit, and a control unit:

calculating random fault rates, systematic fault rates, parametric fault rates, and areas of a plurality of layouts of interest, wherein calculating systematic fault rates comprises:
 a) determining a plurality of Design Of Experiment (DOE) rule values for a design rule;
 b) measuring DOE design rule-based fault rates;
 c) counting numbers of features corresponding to each of the DOE rule values in each of the layouts of interest;
 d) calculating a systematic fault rate of the design rule using the DOE rule value-based fault rates and the numbers of features;
 performing steps a)-d) for a plurality of design rules used in the layout of interest; and
 calculating the systematic fault rate of the layout of interest using a plurality of the calculated systematic fault rates of the design rules;
calculating area-based fault rates of the plurality of layouts of interest using the random fault rates, the systematic fault rates, the parametric fault rates, and the areas; and
selecting layouts of interest to be corrected from among the plurality of layouts of interest using the area-based fault rates.

2. The method of claim 1, wherein calculating the random fault rates comprises:

calculating a fault size distribution of fault sizes, and a size of a critical area depending upon the fault sizes for each layer of the layout of interest;
calculating layer-based random fault rates using the fault size distributions and the sizes of critical areas; and
calculating the random fault rates of the layouts of interest using the layer-based random fault rates.

3. The method of claim 1, wherein calculating area-based fault rates is performed by dividing sums of the random fault rates, systematic fault rates and parametric fault rates by the areas of the layouts of interest.

4. The method of claim 1, wherein selecting the layouts of interest to be corrected from among the plurality of layouts of interest comprises arranging the area-based fault rates in descending order and selecting the layouts of interest to be corrected based on the order in which an arrangement order of the area-based fault rates are arranged.

5. A mask manufactured using the method of analyzing the layouts of semiconductor integrated circuit devices of claim 1.

6. A semiconductor integrated circuit device mask manufactured using the mask of claim 5.

7. A method of analyzing layouts of semiconductor integrated circuit devices, the method comprising the following steps performed by a system having a random fault rate calculation unit, a systematic fault rate calculation unit, a parametric fault rate calculation unit, an area based-fault rate calculation unit, and a control unit:

calculating random fault rates, systematic fault rates, parametric fault rates, and areas of a plurality of layouts of interest, wherein calculating parametric fault rates comprises:

a) determining a plurality of DOE rule values for a design rules;

b) measuring DOE design rule-based fault rates;

c) counting numbers of features corresponding to the each of DOE rule values in each of the layouts of interest;

d) calculating a parametric fault rate of the design rule using the DOE rule value-based fault rates and the numbers of features;

performing steps a)-d) for a plurality of design rules used in the layout of interest; and calculating the parametric fault rate of the layout of interest using a plurality of calculated parametric fault rates of the design rules;

calculating area-based fault rates of the plurality of layouts of interest using the random fault rates, the systematic fault rates, the parametric fault rates, and the areas; and selecting layouts of interest to be corrected from among the plurality of layouts of interest using the area-based fault rates.

* * * * *